(12) United States Patent
Moon

(10) Patent No.: US 9,012,979 B2
(45) Date of Patent: Apr. 21, 2015

(54) SEMICONDUCTOR DEVICE HAVING AN ISOLATION REGION SEPARATING A LATERAL DOUBLE DIFFUSED METAL OXIDE SEMICONDUCTOR (LDMOS) FROM A HIGH VOLTAGE CIRCUIT REGION

(71) Applicant: Dongbu Hitek Co., Ltd., Seoul (KR)

(72) Inventor: Nam Chil Moon, Bucheon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 13/832,084

(22) Filed: Mar. 15, 2013

(65) Prior Publication Data

US 2014/0264585 A1    Sep. 18, 2014

(30) Foreign Application Priority Data

Mar. 12, 2013    (KR) .......................... 10-2013-0026151

(51) Int. Cl.
*H01L 29/66* (2006.01)
*H01L 29/78* (2006.01)

(52) U.S. Cl.
CPC ...... *H01L 29/7816* (2013.01); *H01L 29/66681* (2013.01)

(58) Field of Classification Search
CPC .................. H01L 21/823892; H01L 29/7816; H01L 29/66681; H01L 21/76283; H01L 21/823878

USPC .......... 257/140, 328, 343, E29.261, 506, 355, 257/E21.373; 438/294, 196, 296
See application file for complete search history.

(56) References Cited

U.S. PATENT DOCUMENTS

| | | | |
|---|---|---|---|
| 5,485,027 A * | 1/1996 | Williams et al. .............. 257/343 |
| 2006/0006462 A1 * | 1/2006 | Chang et al. .................. 257/341 |
| 2009/0020811 A1 * | 1/2009 | Voldman ....................... 257/337 |
| 2012/0018804 A1 * | 1/2012 | Khemka et al. ............... 257/337 |

FOREIGN PATENT DOCUMENTS

JP          02-044759         2/1990
KR    10-2009-0103607 A    10/2009

OTHER PUBLICATIONS

Office Action dated Feb. 17, 2014 in Korean Application No. 10-2013-0026151.

* cited by examiner

*Primary Examiner* — Marcos D. Pizarro
*Assistant Examiner* — Cesar Lopez
(74) *Attorney, Agent, or Firm* — Saliwanchik, Lloyd & Eisenschenk

(57) ABSTRACT

A semiconductor device and method of manufacturing the same are provided. A device can include an LDMOS region and a high side region on a semiconductor substrate. The device can further include an insulating region separating the LDMOS region from the high side region and the insulating region can include a plurality of second conductive type wells, a plurality of second conductive type buried layer patterns, or both.

7 Claims, 5 Drawing Sheets

SEMICONDUCTOR DEVICE HAVING AN ISOLATION REGION SEPARATING A LATERAL DOUBLE DIFFUSED METAL OXIDE SEMICONDUCTOR (LDMOS) FROM A HIGH VOLTAGE CIRCUIT REGION

CROSS-REFERENCE TO RELATED APPLICATION

This application claims the benefit under 35 U.S.C. §119 of Korean Patent Application No. 10-2013-0026151, filed Mar. 12, 2013, which is hereby incorporated by reference in its entirety.

BACKGROUND

Power semiconductors are commonly used in various application fields. A device having a power semiconductor is controlled by a low-power circuit operated with several tens of volts or below. This low-voltage circuit may control a high-voltage-driven circuit that is operated with several hundreds of volts and provides high-voltage power to another electronic device. Therefore, such a circuit has a low side region and a high side region.

The high side region of an integration circuit is electrically insulated from the low side region by insulation junction. A low-voltage signal is level-shifted to higher voltage by a level shift transistor so that a low-voltage control signal is suitable for a high-voltage element.

That is, a high voltage integration circuit according to the related art is divided into a high side region and a level shifter. The high side region represents a region floated to high voltage, and the level shifter serves to transmit a signal of a low side region to the high side region.

FIG. 1 is a schematic planar view illustrating a general high-voltage semiconductor device.

Referring to FIG. 1, in a high-voltage integration circuit 1, a laterally-diffused metal oxide semiconductor (LDMOS; also known as a lateral double diffused metal oxide semiconductor) device 4 can be surrounded by a high side region 12b, and the LDMOS device 4 can be separated from the high side region 12b by a certain distance by an insulating region 1a.

FIG. 2 is a cross-sectional view illustrating the related art semiconductor device taken along line A-A' of FIG. 1, wherein the semiconductor device has a high voltage withstanding Double Reduced Surface Field (RESURF) structure and a level shift function.

Referring to FIG. 2, the semiconductor device includes an N channel RESURF LDMOS field effect transistor (LDMOSFET) (LDMOS region) on the left side and a RESURF separation island region (high side region). The semiconductor device also includes a semiconductor substrate 1 doped with P−, N− epitaxial layers 12a and 12b, a P diffusion region 3 contacted to the P− substrate 1, an N+ buried diffusion region 4, an N diffusion region 5, a P diffusion region 6, an oxide film 7, an aluminum wiring 8, a polysilicon gate 9, an aluminum electrode 10, and polysilicon 11.

The aluminum electrode 10 contacts the N diffusion region 5 and the P diffusion region 6 and is formed at the same location as the RESURF separation island region. The polysilicon 11, to which the same potential as the P diffusion region 3 is applied, serves as a field plate. The N diffusion region 5 and the N+ buried diffusion region 4 form RESURF structures surrounded by the P diffusion regions 3.

In the related art semiconductor device configured as described above, the N channel LDMOSFET is turned on by biasing the gate electrode 9 to positive potential, and current that flows in the P diffusion region 6 induces a potential difference between the electrode 10 and the aluminum wiring 8. By outputting this potential difference, a logic signal applied to the gate 9 may be level-shifted to a high-potential side.

In order to reduce leakage current that flows from a level shift transistor to the high side region 12b, a P− epitaxial layer having low concentration is used for insulation. However, the reduction of the leakage current is limited. In the case of increasing a distance W of the insulating region 1a, an amount of charges for forming a RESURF structure is unbalanced, and thus a breakdown voltage rapidly decreases.

That is, when a P type well is formed to insulate the N channel LDMOSFET from the RESURF separation island region, as the length of the P type well increases, the leakage current is reduced more efficiently, but the breakdown voltage rapidly decreases.

BRIEF SUMMARY

Embodiments of the subject invention provide a semiconductor device, and a method for manufacturing the same, that can maintain high breakdown voltage without increasing a distance between a region of a level shift transistor and a high side region.

Embodiments also provide a method for forming a region of ion injection through a mask on an insulating region located between a laterally-diffused metal oxide semiconductor (LDMOS; also referred to as a lateral double-diffused metal oxide semiconductor) transistor serving as a level shifter and a high side region in order to give a semiconductor device that can maintain high breakdown voltage.

In an embodiment, a semiconductor device can include a lateral double diffused metal oxide semiconductor (LDMOS) region and a high side region formed on a semiconductor substrate and an insulating region separating the LDMOS region from the high side region. The insulating region can include a plurality of second conductive type wells on the semiconductor substrate, a plurality of second conductive type buried layers on the semiconductor substrate, or both. For example, the insulating region can include a plurality of second conductive type wells and no second conductive type buried layers, a plurality of second conductive type wells and one second conductive type buried layer, no second conductive type wells and a plurality of second conductive type buried layers, one second conductive type well and a plurality of second conductive type buried layers, or a plurality of second conductive type wells and a plurality of second conductive type buried layers.

In another embodiment, a method of fabricating a semiconductor device can include: forming a lateral double diffused metal oxide semiconductor (LDMOS) region and a high side region on a semiconductor substrate; and forming an insulating region separating the LDMOS region from the high side region. Forming the insulating region can include forming a plurality of second conductive type wells on the semiconductor substrate, forming a plurality of second conductive type buried layers on the semiconductor substrate, or both.

DETAILED DESCRIPTION

Reference will now be made in detail to the embodiments of the present disclosure, examples of which are illustrated in the accompanying drawings.

When the terms "on" or "over" are used herein, when referring to layers, regions, patterns, or structures, it is understood that the layer, region, pattern, or structure can be directly on another layer or structure, or intervening layers, regions, patterns, or structures may also be present. When the terms "under" or "below" are used herein, when referring to layers, regions, patterns, or structures, it is understood that the layer, region, pattern, or structure can be directly under the other layer or structure, or intervening layers, regions, patterns, or structures may also be present.

Figure 2:
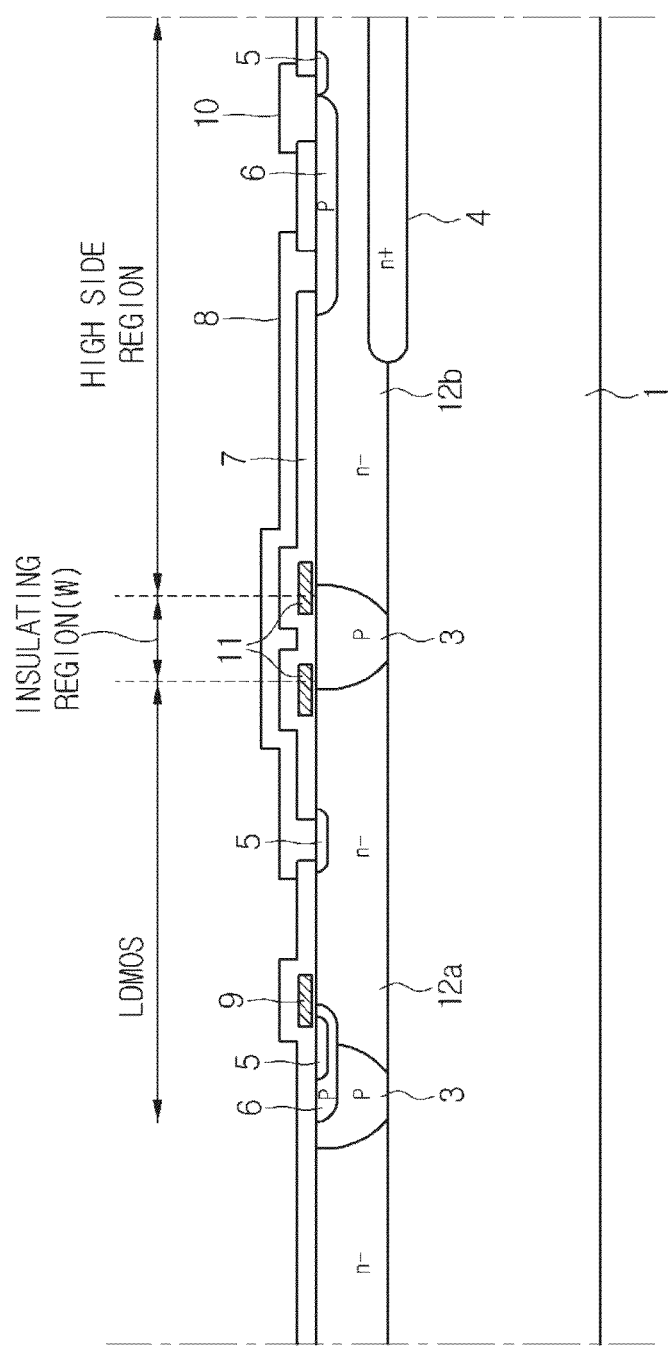
FIG. 2 is a cross-sectional view of a related art semiconductor device taken along line A-A' of FIG. 1.

Referring again to FIG. 2, a high-voltage semiconductor device can be divided into a laterally-diffused metal oxide semiconductor (LDMOS; also known as a lateral double diffused metal oxide semiconductor) region 12a in which an LDMOS transistor serving as a level shifter is formed, a high side region 12b floated to high voltage, and an insulating region for blocking current that flows from the LDMOS region 12a to the high side region 12b. In an embodiment of the subject invention, the layout of the insulating region can be modified compared to that in FIG. 2 in order to provide a structure of a semiconductor device for maximizing the insulating effect while maintaining high breakdown voltage.

Figure 1:
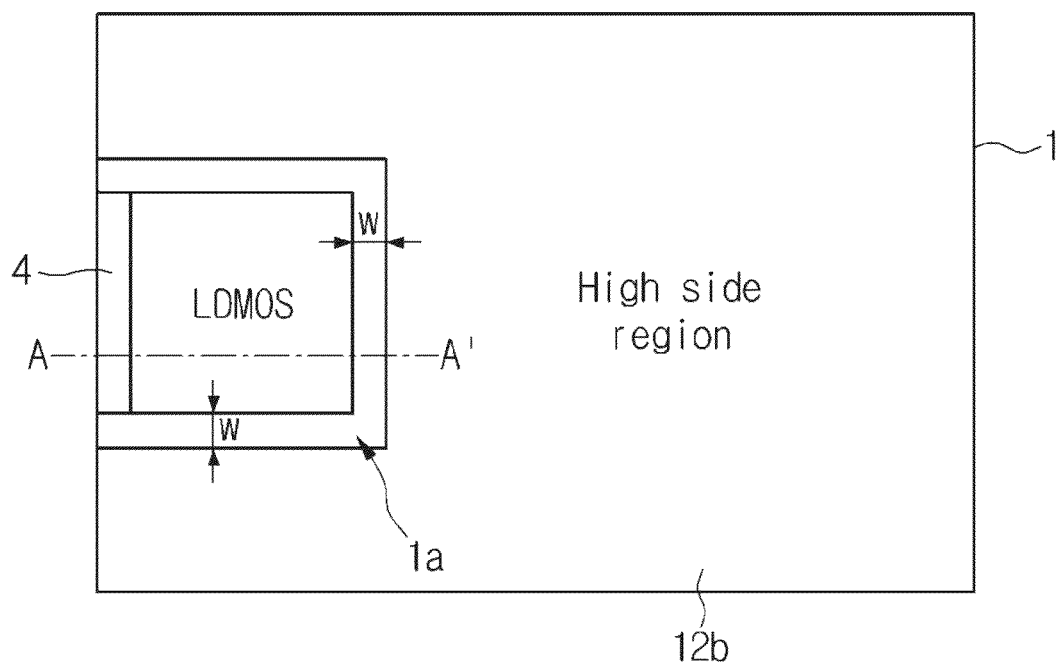
FIG. 1 is a schematic planar view illustrating a general high-voltage semiconductor.
Figure 3:
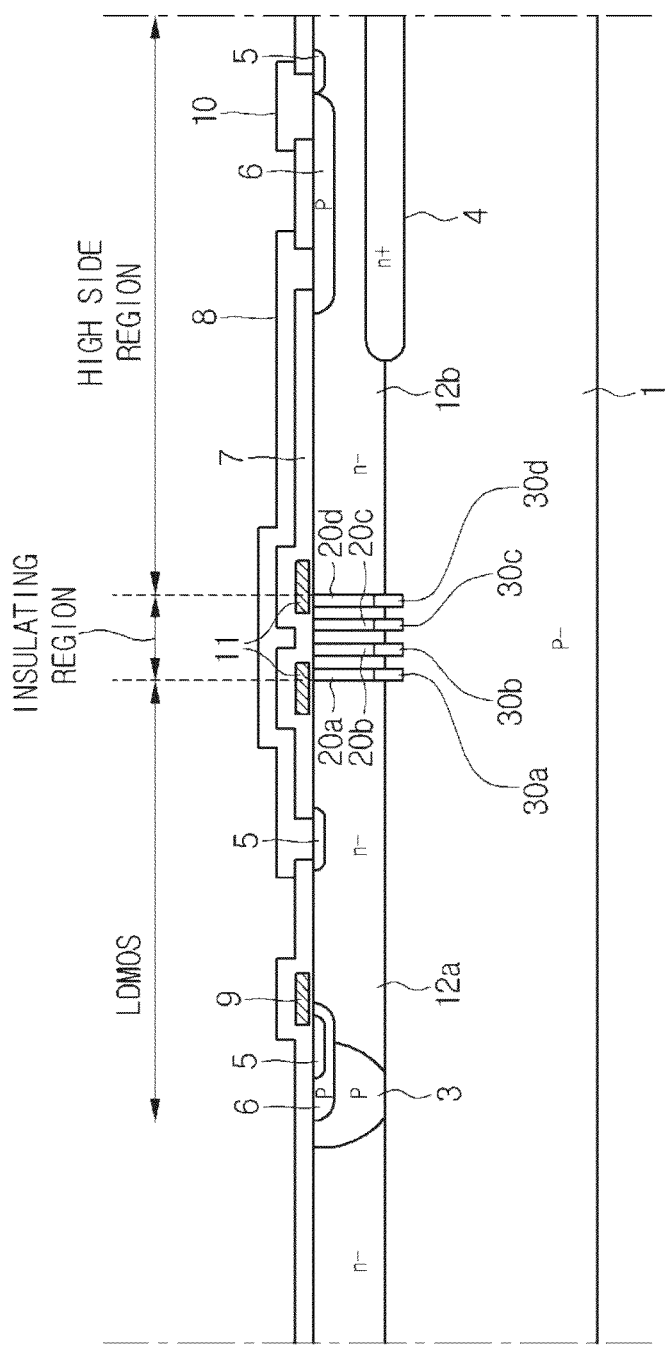
FIG. 3 is a cross-sectional view of a semiconductor device according to an embodiment of the subject invention, as taken along line A-A' of FIG. 1.

FIG. 3 is a cross-sectional view of a semiconductor device according to an embodiment of the subject invention, taken along line A-A' of FIG. 1.

Referring to FIG. 3, a semiconductor device can include an N channel Double Reduced Surface Field (RESURF) LDMOS field effect transistor (LDMOSFET) (LDMOS region) on the left side and a RESURF separation island region (high side region). The semiconductor device can also include a semiconductor substrate 1 (e.g., doped with P−, N− epitaxial layers 12a and 12b), a P diffusion region 3 contacted to the P− substrate 1, an N+ buried diffusion region 4, an N diffusion region 5, a P diffusion region 6, an insulating film 7, a wiring 8, a gate 9, an electrode 10, and polysilicon 11. The insulating film 7 can be, for example, an oxide film, though embodiments are not limited thereto. The wiring 8 can be, for example, an aluminum wiring, though embodiments are not limited thereto. The gate 9 can be, for example, a polysilicon gate, though embodiments are not limited thereto. The electrode 10 can be, for example, an aluminum electrode, though embodiments are not limited thereto.

The electrode 10 can contact the N diffusion region 5 and the P diffusion region 6 and can be formed at the same location as the RESURF separation island region. The polysilicon 11, to which the same potential as the P diffusion region 3 is applied, serves as a field plate (polysilicon). The N diffusion region 5 and the N+ buried diffusion region 4 form RESURF structures surrounded by the P diffusion regions 3.

A P-type well having a low concentration can be formed to insulate the LDMOS region from the high side region.

Hereinafter, a method for forming an insulating region according to an embodiment will be described.

A P type buried layer can be formed on a semiconductor substrate between a region where the LDMOS transistor is formed and the high side region. During the formation of the P type buried layer, a photoresist pattern (not illustrated) can be formed on the semiconductor substrate 1 (e.g., a P-type semiconductor substrate), and then P type buried layer patterns 30a, 30b, 30c, 30d having certain line widths can be formed. In an embodiment, the P type buried layer patterns 30a to 30d can be formed by performing development and exposure processes. Although the drawings show that four P type buried layer patterns can be formed, embodiments are not limited thereto. In various embodiments, two or more P type buried layer patterns can be formed according to a size of the insulating region. For example, two, three, four, five, six, seven, eight, nine, 10, 11, 12, 13, 14, 15, or more P type buried layer patterns can be formed.

Thereafter, the photoresist pattern can be removed, and epitaxial layers 12a and 12b doped with N− can be formed over the semiconductor substrate. In an embodiment, an ion injection process can be performed to form P wells doped with P-type impurities at a location or locations corresponding to the P type buried layer patterns on the N− epitaxial layers. The photoresist pattern for forming the P type buried layer patterns can be used, and P wells 20a, 20b, 20c, 20d can be formed on the P buried layer patterns 30a to 30d.

A thermal process can be performed on the semiconductor substrate so that the P type buried layer patterns 30a to 30d and the P wells 20a to 20d, respectively, diffuse and contact each other.

Therefore, between the LDMOS region and the high side region, an insulating region in which P wells and N− layers alternate with each other can be formed. Since a depletion region can be formed due to a PN junction, the insulating layer can block a drain current that flows from the LDMOS region to the high side region.

That is, according to embodiments of the subject invention, the effect of blocking a leakage current can be improved, and a high breakdown voltage can be maintained without increasing a line width of a P type layer of an insulating layer.

Figure 4:
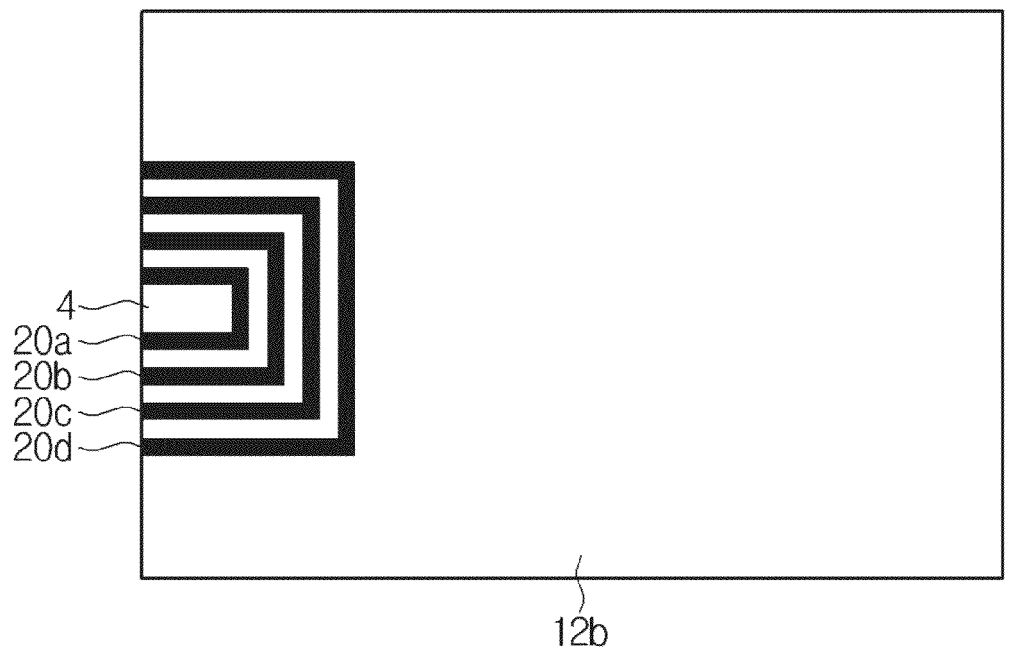
FIG. 4 is a schematic planar view of a high-voltage integration circuit according to an embodiment of the subject invention.

FIG. 4 is a schematic planar view illustrating a high-voltage semiconductor device according to an embodiment of the subject invention.

Referring to FIG. 4, the layout of the insulating region between the LDMOS region 4 and the high side region 12b can have a structure in which the P wells 20a to 20d surround three sides of the LDMOS region 4 and alternate with N layers.

Figure 5:
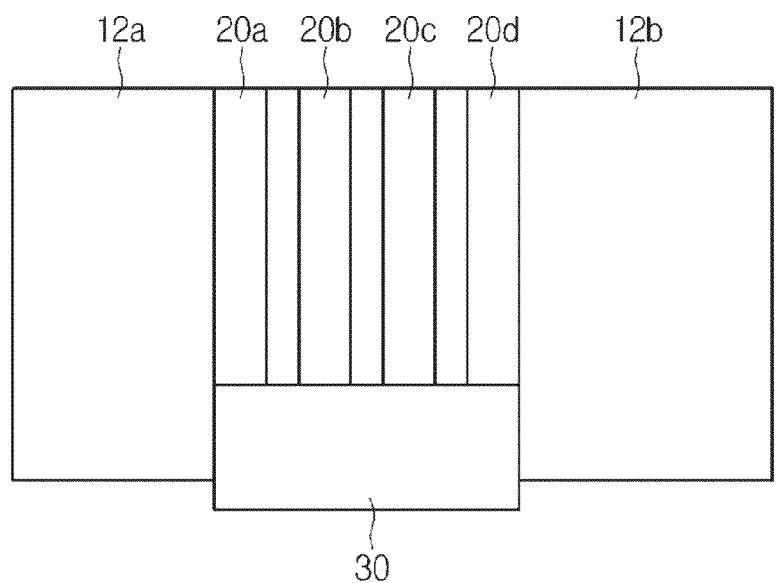
FIG. 5 is a cross-sectional view of a layout of a high-voltage semiconductor device according to an embodiment of the subject invention.

FIG. 5 is a cross-sectional view illustrating a layout of a high-voltage semiconductor device according to an embodiment of the subject invention.

Referring to FIG. 5, a P type buried layer 30 can be formed on a semiconductor substrate. N epitaxial layers 12a and 12b can be stacked, and a photoresist pattern for sections for forming P wells can be formed on the N type epitaxial layers 12a and 12b. P type impurities can be injected to regions opened by the photoresist so as to form P wells 20a to 20d. Thereafter, a thermal process can be performed on the semiconductor substrate so that the P wells 20a to 20d and the P type buried layer 30 diffuse and adhere to each other. As described above, a depletion region can be formed due to a PN junction, and thus a drain current that flows from the LDMOS region to the high side region can be blocked. Each of the P wells 20a to 20d can have a certain line width, and at least two P wells can be formed. More specifically, each of the P wells 20a to 20d can have a line width such that the P wells diffuse and contact the P type buried layer 30 when the thermal process is performed.

Figure 6:
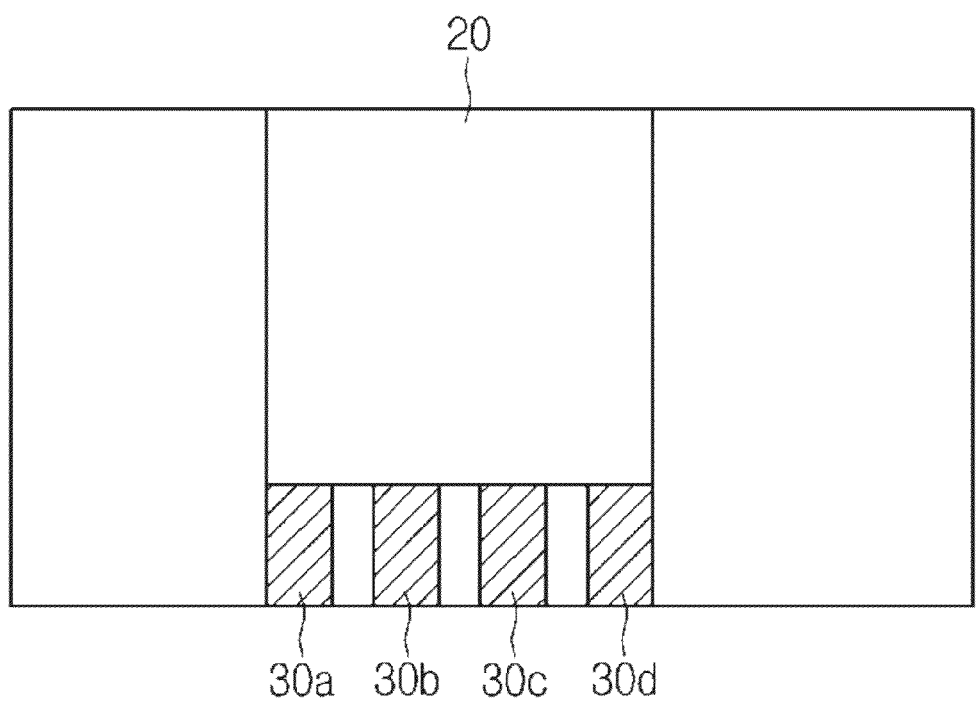
FIG. 6 is a cross-sectional view of a layout of a high-voltage semiconductor device according to an embodiment of the subject invention.

FIG. 6 is a cross-sectional view illustrating a layout of a high-voltage semiconductor device according to an embodiment of the subject invention.

Referring to FIG. 6, a photoresist pattern can be formed on a region where an insulating region is to be formed on a semiconductor substrate, and P type buried layer patterns 30a to 30d can also be formed on that region. An N type epitaxial layer can be stacked, and a single P well 20 can be formed on the insulating region. Thereafter, a thermal process can be performed so that the P well 20 and the P type buried layer patterns 30a to 30d diffuse and join each other. Each of the P type buried layer patterns 30a to 30d can form a depletion region due to a PN junction and can thus serve as an insulating region for blocking a drain current that flows from the LDMOS region to the high side region.

According to embodiments of the subject invention, a structure of an insulating region between an LDMOS transistor serving as a level shifter and a high side region can be modified, and thus a leakage current that flows from a level shift transistor to a high side region can be efficiently inhibited without increasing the length of the insulating region.

Further, even though the length of the insulating region is not increased, a breakdown voltage of a semiconductor device does not decrease.

Moreover, according to the embodiments, a high breakdown voltage can be obtained without performing additional masking or additional processes, and thus manufacturing costs can be reduced.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

What is claimed is:

1. A semiconductor device, comprising:
    a lateral double diffused metal oxide semiconductor (LDMOS) region on a semiconductor substrate;
    a high side region on the semiconductor substrate; and
    an insulating region laterally separating the LDMOS region from the high side region,
    wherein the LDMOS region comprises a gate, a first first-conductive-type diffusion region, and a first second-conductive-type diffusion region,
    wherein the high side region comprises an electrode, a second first-conductive-type diffusion region, and a second second-conductive-type diffusion region,
    wherein the insulating region comprises at least a portion of a polysillicon layer, and
    wherein the insulating region further comprises a plurality of second-conductive-type wells on the semiconductor substrate, a plurality of second-conductive-type buried layers on the semiconductor substrate, or both.

2. The semiconductor device according to claim 1, wherein a plurality of continuous PN junctions are formed on the semiconductor substrate in the insulation region and adjacent to the LDMOS region.

3. The semiconductor device according to claim 1, wherein the insulating layer comprises exactly one second-conductive-type buried layer and at least two second-conductive-type wells connected to the second-conductive-type buried layer.

4. The semiconductor device according to claim 1, wherein the insulating layer comprises at least two second-conductive-type buried layers and exactly one second-conductive-type well connected to the at least two second-conductive-type buried layers.

5. The semiconductor device according to claim 1, wherein the insulating region comprises a plurality of second-conductive-type wells on the semiconductor substrate and a plurality of second-conductive-type buried layers on the semiconductor substrate.

6. The semiconductor device according to claim 5, wherein each second-conductive-type buried layer is connected to a second conductive type well.

7. The semiconductor device according to claim 5, wherein the at least a portion of a polysilicon layer is over at least one of the second-conductive-type wells of the plurality of second-conductive-type wells and over at least one of the second-conductive-type buried layers of the plurality of second-conductive-type buried layers.

* * * * *